US008895398B2

(12) United States Patent
Wang (10) Patent No.: US 8,895,398 B2
(45) Date of Patent: Nov. 25, 2014

(54) METHOD FOR MANUFACTURING DOUBLE-GATE STRUCTURES (75) Inventor: Le Wang, Wuxi (CN)

(73) Assignees: CSMC Technologies Fab1 Co., Ltd., Wuxi (CN); CSMC Technologies Fab2 Co., Ltd., Wuxi (CN)

( * ) Notice: Subject to any disclaimer, the term of this patent is extended or adjusted under 35 U.S.C. 154(b) by 202 days.

(21) Appl. No.: 13/807,307

(22) PCT Filed: Nov. 3, 2011

(86) PCT No.: PCT/CN2011/081718
§ 371 (c)(1),
(2), (4) Date: Dec. 28, 2012

(87) PCT Pub. No.: WO2012/062175
PCT Pub. Date: May 18, 2012

(65) Prior Publication Data
US 2013/0102139 A1 Apr. 25, 2013

(30) Foreign Application Priority Data

Nov. 9, 2010 (CN) .......................... 2010 1 0538334

(51) Int. Cl.
H01L 21/336 (2006.01)
H01L 29/66 (2006.01)
H01L 21/8234 (2006.01)
H01L 21/285 (2006.01)

(52) U.S. Cl.
CPC .. *H01L 29/66484* (2013.01); *H01L 21/823443* (2013.01); *H01L 21/823468* (2013.01); *H01L 21/28518* (2013.01)
USPC ............................ 438/283; 438/275; 438/585

(58) Field of Classification Search
USPC .......................................... 438/585, 275, 283
See application file for complete search history.

(56) References Cited

U.S. PATENT DOCUMENTS 6,074,908 A * 6/2000 Huang ........................ 438/241
2007/0152276 A1 * 7/2007 Arnold et al. ................. 257/369
2008/0073733 A1 * 3/2008 Kudo et al. ................... 257/412

* cited by examiner

*Primary Examiner* — Zandra Smith
*Assistant Examiner* — Jamie C Niesz
(74) *Attorney, Agent, or Firm* — Anova Law Group, PLLC (57) ABSTRACT A method is provided for manufacturing a double-gate structure. The method includes providing a substrate and forming a first gate region on a surface of the substrate using a first gate layer. The method also includes forming a second gate layer on the surface of the substrate, wherein the second gate layer covers the first gate region, forming an etch-stop layer on the second gate layer, and forming a silicide layer on the etch-stop layer. The method also includes forming a second gate region, different from the first gate region, containing the second gate layer and the silicide layer without the etch-stop layer. Further, the etch-stop layer is arranged between the second gate layer and the silicide layer to facilitate even etching of the second gate layer around the first gate region.

12 Claims, 6 Drawing Sheets

METHOD FOR MANUFACTURING DOUBLE-GATE STRUCTURES

CROSS-REFERENCES TO RELATED APPLICATIONS

This application claims the priority of Chinese patent application no. 201010538334.6, filed on Nov. 9, 2010, the entire contents of which are incorporated herein by reference.

FIELD OF THE INVENTION

The present invention generally relates to the field of semiconductor manufacturing and, more particularly, to the methods and processes for manufacturing double-gate structures in semiconductor devices.

BACKGROUND

With advancements in integrated circuit technologies, the range for applying Bipolar-CMOS-DMOS (BCD), a monolithic technique, has become increasingly wider. With the BCD, the bipolar device, Complementary Metal-Oxide-Semiconductor (CMOS) device, and Double-Diffused Metal-Oxide Semiconductor (DMOS) device can be manufactured on a same chip. The BCD combines the advantages of bipolar devices (large transconductance and high load-driving capability), the advantages of CMOS devices (high degree of integration and low power consumption), and the advantages of DMOS devices (low power consumption and being able to work in switching applications and to transmit large power to the load without expensive packaging and cooling systems). By using BCD, power consumption can be greatly lowered, system performance can be improved, packaging cost for the integrated circuits can be reduced, and better reliability can be achieved.

A double-gate process, i.e., manufacturing the gate regions of at least two types of devices on the same chip at the same time, is one of the most important processes used in BCD. However, the conventional processes of manufacturing double-gate structures often cause device malfunctions, parameter abnormalities and the like.

The disclosed methods and systems are directed to solve one or more problems set forth above and other problems.

BRIEF SUMMARY OF THE DISCLOSURE

One aspect of the present disclosure includes a method for manufacturing a double-gate structure. The method includes providing a substrate, forming a first gate region on a surface of the substrate using a first gate layer, and forming a second gate layer on the surface of the substrate. The second gate layer covers the first gate region. The method also includes forming an etch-stop layer on the second gate layer and forming a silicide layer on the etch-stop layer. The method also includes forming a second gate region being different from the first gate region and containing the second gate layer and the silicide layer without the etch-stop layer. Further, the etch-stop layer is arranged between the second gate layer and the silicide layer to facilitate even etching of the second gate layer around the first gate region.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

FIGS. 1-7 illustrate a conventional double-gate process used for manufacturing gate regions of a High-Voltage Metal-Oxide Semiconductor (HVMOS) device and a Low-Voltage Metal-Oxide Semiconductor (LVMOS) device.

In the conventional double-gate process, a first polysilicon layer is used for forming the gate region of the HVMOS device (i.e., the first gate region, Poly1), and the second polysilicon layer and a tungsten silicide layer on the second polysilicon layer are used for forming the gate region of the LVMOS device (i.e., the second gate region, Poly 2). That is, the Poly2 includes both the second polysilicon layer and the tungsten silicide layer. As the silicide layer of the second gate region, the tungsten silicide layer on the second polysilicon layer can reduce the resistance of the gate polysilicon in the second gate region. In such manufacturing process, however, the critical dimension (CD) of the two layers has to be strictly controlled, thus the products by the conventional method often have poor electrical performance and fail to meet practical needs.

Figure 1:
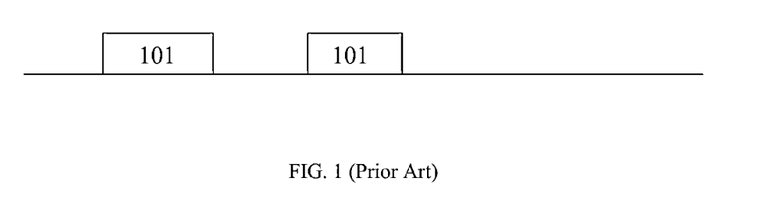
FIGS. 1-3 illustrate a conventional method for manufacturing a double-gate structure.

As shown in FIG. 1, a substrate is first provided and a gate region 101 of an HVMOS device is formed on the substrate. More specifically, the gate region 101 of the HVMOS device is formed by depositing a first polysilicon layer on the substrate and performing other steps such as photolithography and etching.

Figure 2:
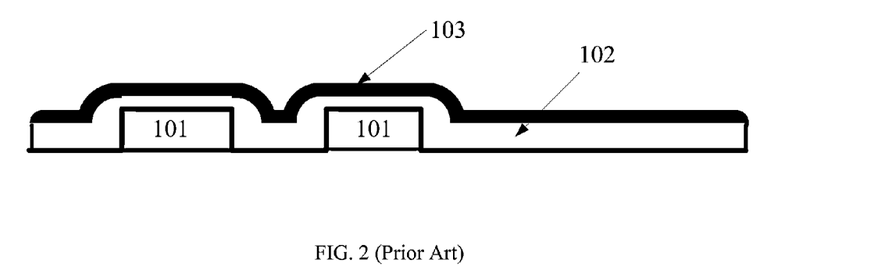

As shown in FIG. 2, a second polysilicon layer 102 and a tungsten silicide layer 103 are formed on the substrate by firstly depositing a second gate polysilicon layer (or a second polysilicon layer) and then depositing a tungsten silicide layer. The second polysilicon layer 102 and the tungsten silicide layer 103 can be formed using Low Pressure Chemical Vapor Deposition (LPCVD).

Figure 3:
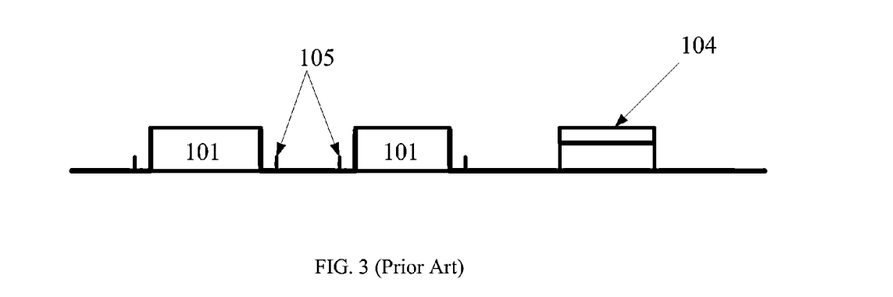
Figure 4:
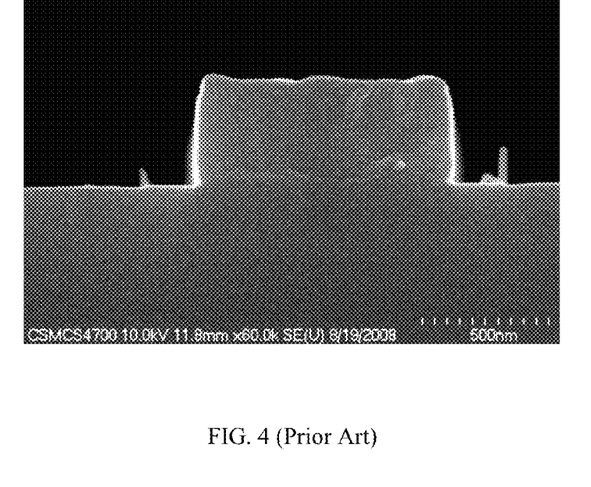
FIG. 4 is an electron micrograph of a cross-section of a device produced by the conventional method for manufacturing a double-gate structure.
Figure 5:
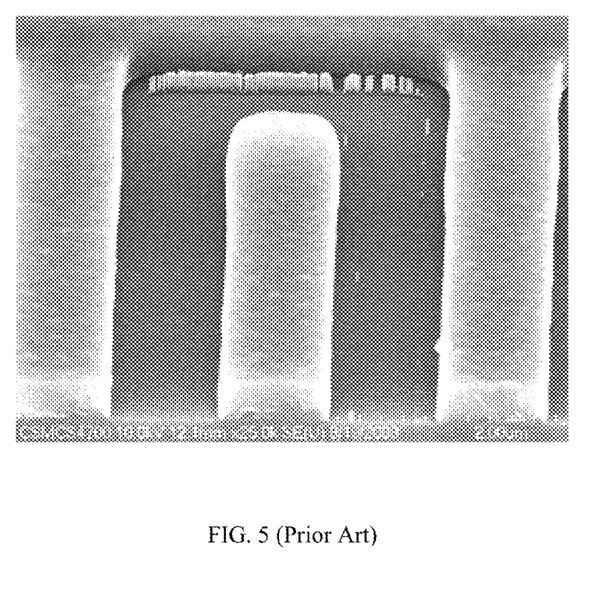
FIG. 5 is another electron micrograph of a cross-section of a device produced by the conventional method for manufacturing a double-gate structure.

As shown in FIG. 3, various steps, such as photolithography and etching, are performed on the second polysilicon layer and the tungsten silicide layer to form a gate region 104 of an LVMOS device. The etching process may be an anisotropic etching process, and needle-like gate polysilicon residuals 105 may occur around the gate region 101 of the HVMOS device after the anisotropic etching of the second polysilicon layer and the tungsten silicide layer. FIG. 4 and FIG. 5 show a cross-section view and a top view of a device after etching, respectively, with needle-like gate polysilicon residuals.

Figure 6:
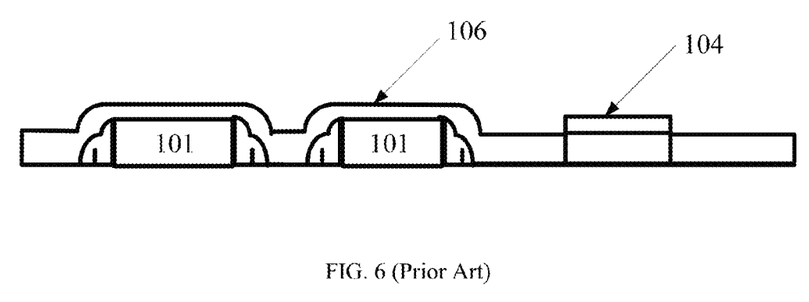
FIGS. 6-7 illustrate a conventional method for manufacturing a double-gate structure.
Figure 7:
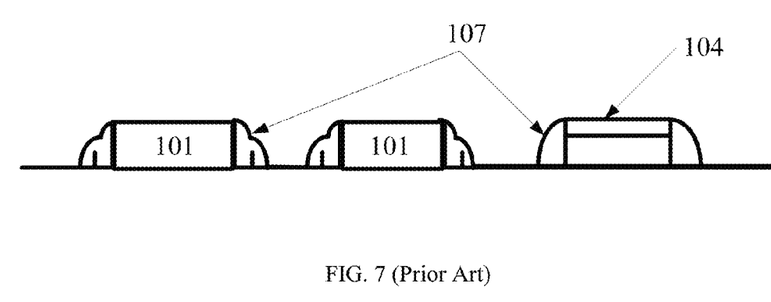
Figure 8:
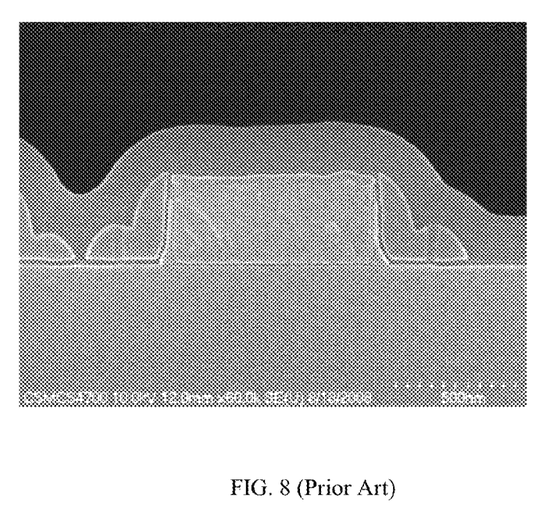
FIGS. 8-9 are electron micrographs of a cross-section of spacers produced by the conventional method for manufacturing a double-gate structure.
Figure 9:
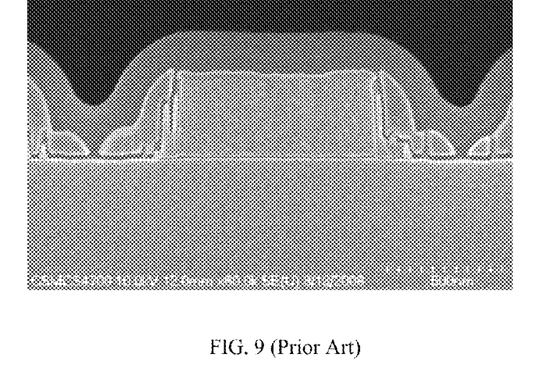

As shown FIG. 6, a spacer dielectric layer 106, which includes a silicon oxide layer and a silicon nitride layer, is further deposited. Further steps such as photolithography and etching are performed to form spacers 107 around the two gate regions 101 and 104, as shown in FIG. 7. After the spacers 107 are formed, some needle-like gate polysilicon residuals remain. FIG. 8 and FIG. 9 show cross-section views of the spacers in the device, and it can be seen that the previous gate polysilicon residuals cause abnormalities in the shape of the spacers of Poly 1. Thus, the performance of the device may be affected.

In order to solve the problem that gate polysilicon residuals occur around Poly1, some conventional technologies have the Poly1 formed with a degree of inclination. Such method may reduce the gate polysilicon residuals to a certain extent, but still fails to completely eliminate the gate polysilicon residuals. Also, such method may achieve the gate polysilicon residual reduction at the expense of compromising the morphology of Poly1 and the electrical performance of the device.

To improve the double-gate process for manufacturing the gate regions, it is found that the cause for the needle-like gate polysilicon residuals around Poly 1 may be the physical and chemical properties of the tungsten silicide. Due to the physical and chemical properties of the tungsten silicide, the vertical thickness of the deposited tungsten silicide layer around Poly1 is larger than the vertical thickness of the deposited tungsten silicide layer in other locations. This may further result in larger vertical thickness of the second polysilicon layer around Poly1 than the second polysilicon layer in other locations. Moreover, if the anisotropic etching of the gate polysilicon layer and the tungsten silicide layer is performed at the same time when forming Poly 2, under the fixed etching condition and etching time, unetched gate polysilicon, i.e. needle-like gate polysilicon residuals, may occur around Poly1.

Figure 10:
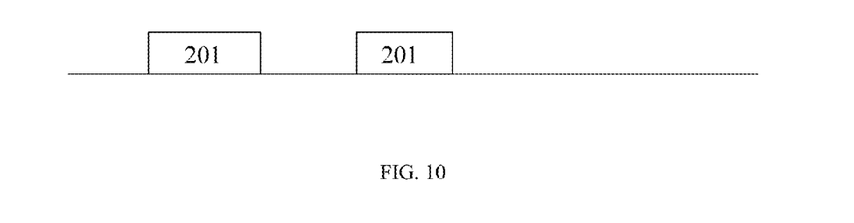
FIGS. 10-17 illustrate a method for manufacturing a double-gate structure consistent with the disclosed embodiments.

FIGS. 10-17 illustrate an improved process for manufacturing a double-gate structure in a semiconductor device consistent with the disclosed embodiments. As shown in FIG. 10, a substrate (not numbered) is provided as the base for the double-gate structure. The substrate may include any appropriate material for making double-gate structures.

For example, the substrate may include a semiconductor structure, e.g., silicon, silicon germanium (SiGe) with a monocrystalline, polycrystalline, or amorphous structure. The substrate may also include a hybrid semiconductor structure, e.g., carborundum, indium antimonide, lead telluride, indium arsenide, indium phosphide, gallium arsenide or gallium antimonide, alloy semiconductor, or a combination thereof. Further, the substrate may include a silicon-on-insulator (SOI) structure. In addition, the substrate may also include other materials, such as a multi-layered structure of epitaxial layer or buried layer. Other materials may also be used.

After the substrate is provided, a first gate region 201 may be formed on the substrate. The first gate region 201 may be formed in any appropriate way, such as by forming a first gate layer (i.e., a first polysilicon layer) using chemical vapor deposition (CVD) or physical vapor deposition (PVD) and performing other steps such as photolithography and etching.

Figure 11:
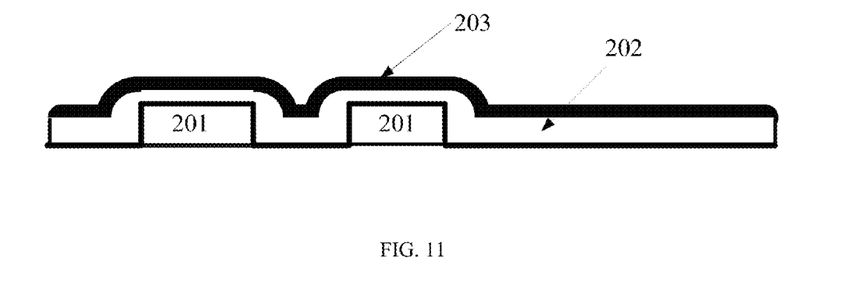

As shown in FIG. 11, a second gate layer 202 is formed on the surface of the substrate, and the second gate layer covers the first gate region 201. The second gate layer 202 may be formed using various methods, such as Low Pressure Chemical Vapor Deposition (LPCVD) and Physical Vapor Deposition (PVD). In certain disclosed embodiments, the second gate layer 202 may be formed by LPCVD.

Further, the second gate layer 202 may include any appropriate material. For example, the second gate layer 202 may be of polysilicon and the thickness of the second gate layer 202 may be in a range of approximately 1450 Å-1550 Å. In certain embodiments, the thickness range may be approximately 1480 Å-1520 Å and preferably at about 1500 Å.

After forming the second gate layer 202, an etch-stop layer 203 is formed on the second gate layer 202. The etch-stop layer 203 may also be of any appropriate material including, for example, an inorganic compound, such as $SiO_2$, SiC, SiON and SiN, or an organic compound, such as SILK and FLARE. Correspondingly, various methods may be used to form the etch-stop layer 203, such as LPCVD and spin coating, which forms the etch-stop layer 203 by spin-coating a layer of solution on the surface of the second gate layer 202 and then bake-hardening the coating layer.

The solution used to form the etch-stop layer 203 may be inorganic or organic. When the solution for the etch-stop layer 203 is inorganic, the spin-coated solution reacts during the bake-hardening to form an inorganic etch-stop layer such as $SiO_2$, SiC, SiON and SiN.

When the solution for the etch-stop layer 203 is organic, the spin-coated solution may be a liquid including a polymeric material. As the bake-hardening is performed at a certain temperature, cross-linking reaction occurring during the bake-hardening may cause the high-molecular polymer to react and generate an organic dielectric, which normally includes CH-groups, such as SILK and FLARE. Further, when the etch-stop layer 203 is organic, since the organic dielectric is CH-based and the inorganic dielectric is Si-based, a high selectivity ratio can be easily obtained between the organic dielectric and the inorganic dielectric. Thus, depending upon the etchant used, subsequent etching can be controlled as passing through the etch-stop layer 203 or stopping at the etch-stop layer 203.

In certain embodiments, the material of the etch-stop layer 203 may be SiN, and the etch-stop layer 203 may be formed by LPCVD. The thickness of the etch-stop layer 203 may be determined according to practical needs of the device.

Figure 12:
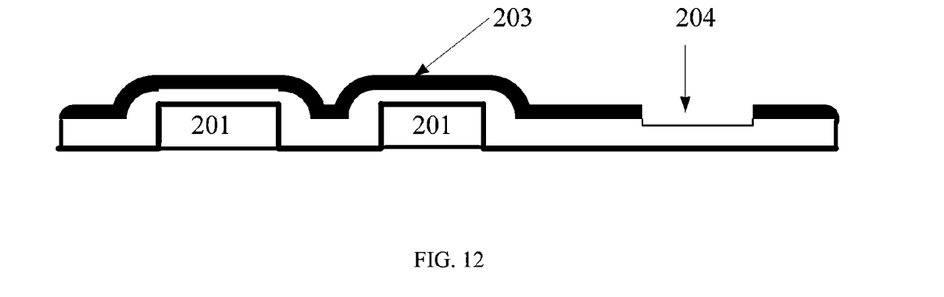

As shown in FIG. 12, a second gate region image opening 204 is formed on the etch-stop layer 203. The second gate region image opening may refer to an opening prepared for forming the second gate region without the cover of the etch-stop layer 203. More specifically, a photoresist layer may first be spin-coated on the etch-stop layer 203. Optionally or additionally, in order to ensure exposure accuracy, an anti-reflecting layer may also be formed between the photoresist layer and the etch-stop layer 203 to reduce unnecessary reflection.

Further, exposure is performed on the photoresist layer using a mask plate having the second gate region image to form a second gate region pattern (not shown) on the surface of the photoresist layer. The photoresist layer in the region of the second gate region pattern is then removed to form a second gate region image opening 204 on the photoresist layer.

Further, a second gate region image opening 204 on the etch-stop layer 203 is formed by, for example, dry etching using the photoresist layer having the second gate region image opening as a mask. In certain embodiments, in order to meet the CD requirement of the second gate region image opening 204, the second gate region image opening 204 may be formed by anisotropic etching, with the etchant including $Cl_2$ and $CH_4$.

It should be noted that, in the process of etching the etch-stop layer 203, it may only require removing the etch-stop layer 203 at the second gate region image opening 204. However, the etch-stop layer 203 may be over-etched, i.e., a certain thickness of the second gate layer 202 at the second gate region image opening 204 may be removed after the etch-stop layer 203 is removed. The etched thickness of the second gate layer 202 may depend on specific situation of the device.

Figure 13:
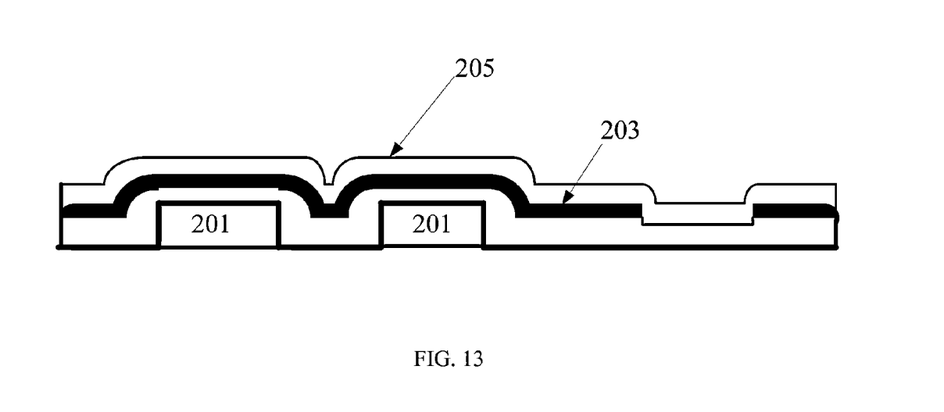

As shown in FIG. 13, a silicide layer 205 is formed on the etch-stop layer 203 having the second gate region image opening 204, and the silicide layer 205 also covers the second gate layer 202 exposed at the second gate region image opening 204.

Due to their physical and chemical properties, e.g., high melting point, low resistivity and high hardness, silicides are usually used in Super Large-Scale Integrated circuits as metal gates, Schottky contacts, or ohmic contacts. In certain embodiments, the silicide layer 205 is used to reduce resistance of the polysilicon layer in the second gate region and, as part of the second gate region, to prepare for the formation of an electrode layer on the second gate region and the subsequent second gate electrode.

The silicide layer 205 may include any appropriate material. In certain embodiment, the silicide may include material(s) selected from a group consisting of NiSi (nickel silicide), $Na_2Si$ (sodium silicide), PtSi (platinum silicide), $TiS_2$ (titanium silicide) and $WSi_2$ (tungsten silicide). Further, the silicide layer 205 may be formed using various methods, such as Chemical Vapor Deposition (CVD), Physical Vapor Deposition (i.e. sputtering), evaporation and electroplating. For example, the silicide layer 205 may be $WSi_2$ formed by chemical vapor deposition (CVD) or physical vapor deposition (PVD).

Due to the inherent properties of silicides, the vertical thickness of the formed silicide layer 205 around the first gate region 201 may be larger than the vertical thickness of the silicide layer 205 in other locations. Thus, for the $WSi_2$ silicide layer 205 in certain embodiments, the vertical thickness of the $WSi_2$ silicide layer 205 around the first gate region may be larger than the vertical thickness of the $WSi_2$ silicide layer 205 in other locations, and the thickness of the $WSi_2$ layer 205 may be in a range of approximately 1200 Å-1350 Å and preferably approximately 1280 Å.

Figure 14:
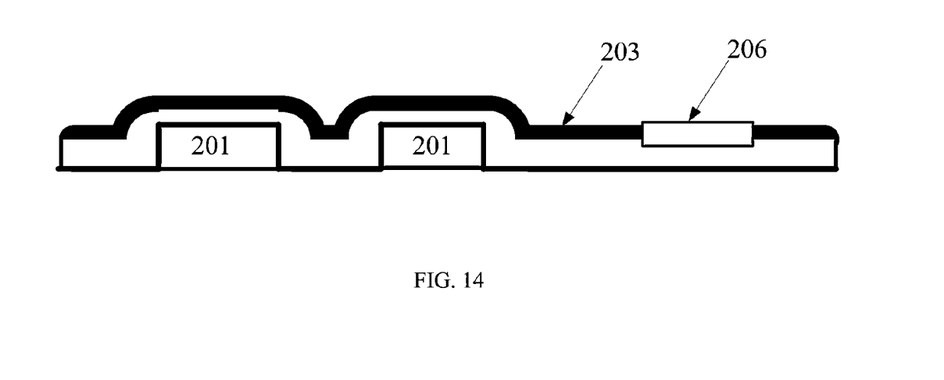

As shown in FIG. 14, the silicide layer 205 on the etch-stop layer 203 is removed so as to form a silicide layer 206 within the second gate region image opening 204.

That is, the entire silicide layer 205 on the etch-stop layer 203 is removed. However, since the etch-stop layer 203 has a second gate region image opening 204, the silicide layer 205 at the second gate region image opening 204 is in direct contact with the material of the second gate layer, without an etch-stop layer 203 in between. Thus, when all of the silicide layer 205 on the etch-stop layer 203 is removed, only the silicide layer 205 at the second gate region image opening 204 remains, i.e., only the silicide layer 206 within the second gate region image 204 remains.

The silicide layer 205 may be removed using various steps. For example, to remove the silicide layer 205, a photoresist layer may be first formed on the silicide layer 205, and a second gate region pattern (not shown) is then formed on the photoresist layer. Further, anisotropic etching is performed on the silicide layer 205 using the photoresist layer with the second gate region pattern as a mask, so as to remove the silicide layer 205 on the etch-stop layer 203 having the second gate region image opening 204 and to form the second gate region image.

The term "second gate region pattern" refers to a two-dimensional pattern on the surface of the photoresist layer, and the region of the pattern is limited to the surface of the photoresist layer without extending downwards, hence it does not have a three-dimensional shape. The term "second gate region image" refers to a three-dimensional image with a three-dimensional shape, and the thickness of the image is the thickness of the silicide layer 205.

In certain embodiments, the anisotropic etchant may include $Cl_2$ and $CH_4$. The concentration of $Cl_2$ may be in a range of approximately 35 sccm-45 sccm, and preferably at about 40 sccm; and the concentration of $CH_4$ may be in a range of approximately 55 sccm-65 sccm, and preferably at about 60 sccm. Depending on the selection of the anisotropic etchant, the silicide layer 205 can be removed with little or even no damage to the etch-stop layer 203, thereby avoiding the possibility of affecting the etch-stop layer 203 or the second gate layer 202 when etching the silicide layer 205. Only the silicide layer 205 on the etch-stop layer 203 outside the second gate region image opening 204 needs to be removed, which fundamentally avoids the cause of the occurrence of gate polysilicon residuals around the first gate region 201.

It should be understood by those skilled in the art that, the mask plate used in the step of forming the second gate region image on the silicide layer 205 is the same as the mask plate used in the step of forming the second gate region image on the etch-stop layer 203. The difference between the two processes of photolithography is that: the photoresist used in step of forming the second gate region image on the silicide layer 205 is a positive photoresist, and the photoresist at the second gate region pattern will remain after exposure and cleaning, which is further used as a mask in the next process of etching to protect the silicide layer below the second gate region pattern. On the other hand, the photoresist used in the previous etching is a negative photoresist, and the photoresist at the second gate region pattern will be removed after exposure and cleaning to etch the second gate region image opening 204 on the etch-stop layer 203.

Figure 15:
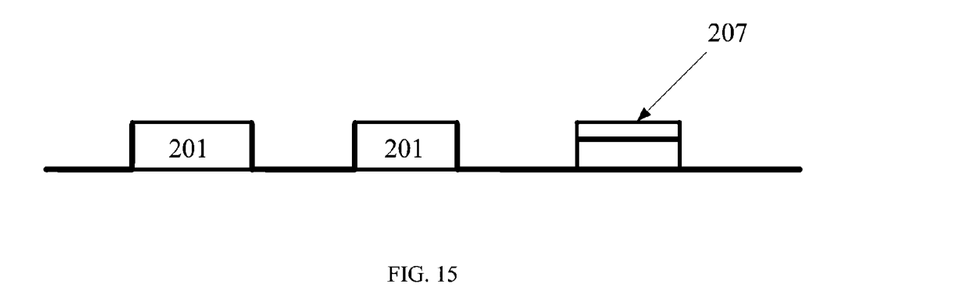

As shown in FIG. 15, the etch-stop layer 203 having the second gate region image opening 204 and the second gate layer 202 below are removed by using the silicide layer 206 with a second gate region image as a mask, to form a second gate region 207.

In other words, this step removes all of the etch-stop layer 203 and the second gate layer below the etch-stop layer 203. Because there is no etch-stop layer 203 at the second gate region image opening 204 after the steps of FIG. 12, the second gate layer 202 below the etch-stop layer 203 certainly does not include the second gate region layer material within the second gate region image opening 204. Therefore, after this step, only the silicide layer 206 and the second gate layer material at the second gate region 207 are left.

In certain embodiments, the second gate region 207 may be formed by performing anisotropic etching on the etch-stop layer 203 having the second gate region image opening 204 and the second gate layer 202 below. The etching uses the photoresist layer with the second gate region pattern as a mask, so as to remove the etch-stop layer 203 and second gate layer 202 below to form the second gate region 207.

Further, the anisotropic etchant used for forming the second gate region 207 may include $Cl_2$, HBr, He and $O_2$. The concentration of $Cl_2$ may be in a range of approximately 15 sccm-25 sccm, and preferably at about 20 sccm; the concentration of HBr may be in a range of approximately 95 sccm-105 sccm, and preferably at about 100 sccm; the concentration of He may be in a range of approximately 5 sccm-10 sccm, and preferably at about 7 sccm; and the concentration of $O_2$ may be in a range of approximately 5 sccm-10 sccm, and preferably at about 7 sccm. Other materials may also be used.

The etchants above can remove the etch-stop layer 203 and the polysilicon of the second gate layer 202, so as to form a second gate region 207. In practice, more than one etchants may be used. For example, the etching process may include firstly removing the etch-stop layer 203 by using an appropriate etchant and then removing the second gate layer 202 by using another etchant, and more specific operational details are omitted.

Because the silicide layer 205 on the etch-stop layer 203 having the second gate region image opening 204 is removed, only the etch-stop layer 203 and the second gate layer 202 remain around the first gate region 201. Further, the thicknesses of the etch-stop layer 203 and the second gate layer are even, i.e., there is no thickness difference in the etch-stop layer 203 and second gate layer 202 around the first gate region 201. Therefore, the etch-stop layer 203 and the second gate layer 202 other than those at the second gate region image opening 204 can be removed in fixed etching condition and etching time without etching residuals, such as the needle-like gate polycrystalline silicon residuals around the first gate region 201 previously mentioned. The problems caused by such etching residuals, such as device malfunction or parameter abnormality, can thus be avoided without compromising the morphology of the first gate region 201. The electrical performance of the device can then be improved. In other words, the etch-stop layer 203 is arranged between the second gate layer 202 and the silicide layer 205 to facilitate even etching of the second gate layer 202 around the first gate region 201.

Further, after the second gate region 207 is formed, other layers and structures may also be formed based on the first gate region 201 and the second region 207. For example, FIG. 16 and FIG. 17 shows forming spacers around the first gate region 201 and the second region 207.

Figure 16:
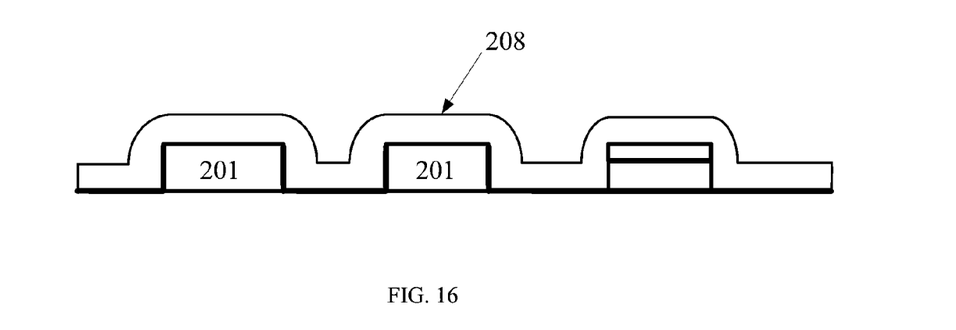

As shown in FIG. 16, a spacer dielectric layer 208 is formed on the first gate region 201 and the second gate region 207. The spacer dielectric layer 208 may include any appropriate material and layer structure, and may cover the first gate region 201 and the second gate region 207. In certain embodiments, the spacer dielectric layer 208 may include a silicon oxide layer and a SiN layer. The thickness of the silicon oxide layer may be in a range of approximately 250 Å-350 Å, and preferably at about 300 Å; and the thickness of the SiN layer may be in a range of approximately 1150 Å-1200 Å, and preferably at about 1175 Å.

Figure 17:
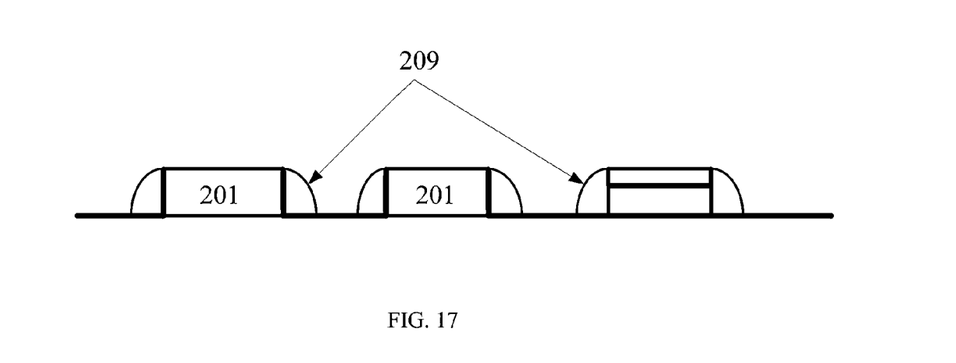

As shown in FIG. 17, the spacer dielectric layer 208 is etched-back so as to form spacers 209 around the first gate region 201 and the second gate region 207. The spacers 209 may be configured to prevent possible punchthrough between the source and the drain during subsequent source-drain implantation if the source/drain is too close to the channel.

It is understood that the disclosed embodiments may be applied to any double-gate manufacturing processes including silicides, and can also be extended to the manufacturing of multi-gate structures including silicides. Various alternations, modifications, or equivalents to the technical solutions of the disclosed embodiments can be obvious to those skilled in the art.

What is claimed is:

1. A method for manufacturing a double-gate structure, comprising:
   providing a substrate;
   forming a first gate region on a surface of the substrate using a first gate layer;
   forming a second gate layer on the surface of the substrate, wherein the second gate layer covers the first gate region;
   forming an etch-stop layer on the second gate layer;
   forming a silicide layer on the etch-stop layer;
   forming a second gate region, different from the first gate region, containing the second gate layer and the silicide layer without the etch-stop layer,
   wherein the etch-stop layer is arranged between the second gate layer and the silicide layer to facilitate even etching of the second gate layer around the first gate region.

2. The method according to claim 1, wherein forming the second gate region includes:
   forming a second gate region image opening on the etch-stop layer to expose the second gate layer within the second gate region image opening;
   forming the silicide layer on the etch-stop layer, wherein the silicide layer covers the second gate layer exposed at the second gate region image opening;
   removing the silicide layer on the etch-stop layer to form a silicide layer with a second gate region image; and
   removing the etch-stop layer having the second gate region image opening and the second gate layer below using the silicide layer with the second gate region image as a mask to form the second gate region.

3. The method according to claim 2, wherein the removing the silicide layer on the etch-stop layer includes:
   forming a photoresist layer on the silicide layer;
   forming a second gate region pattern on the photoresist layer; and
   performing anisotropic etching on the silicide layer using the photoresist layer with the second gate region pattern as a mask, so as to remove the silicide layer on the etch-stop layer to form the second gate region image.

4. The method according to claim 3, wherein the anisotropic etching on the silicide layer uses an anisotropic etchant comprising Cl2 and CH4.

5. The method according to claim 3, wherein removing the etch-stop layer includes:
   performing anisotropic etching on the etch-stop layer having the second gate region image opening and the second gate layer below using the photoresist layer with the second gate region pattern as a mask to remove the etch-stop layer and second gate layer below to form the second gate region.

6. The method according to claim 5, wherein the anisotropic etching on the etch-stop layer uses an anisotropic etchant comprising Cl2, HBr, He and O2.

7. The method according to claim 1, wherein the etch-stop layer is formed by Low Pressure Chemical Vapor Deposition (LPCVD).

8. The method according to claim 1, wherein the etch-stop layer is a SiN layer.

9. The method according to claim 1, wherein the silicide layer is formed by Low Pressure Chemical Vapor Deposition (LPCVD) or Physical Vapor Deposition (PVD), and the silicide layer is a tungsten silicide layer.

10. The method according to claim 1, further including.
    forming a spacer dielectric layer on the surface of the substrate having first gate region and the second gate region, wherein the spacer dielectric layer covers the first gate region and the second gate region; and
    etching-back the spacer dielectric layer to form spacers around the first gate region and the second gate region.

11. The method according to claim 10, wherein the spacer dielectric layer comprises a silicon oxide layer and a SiN layer.

12. The method according to claim 1, wherein:
    the silicide layer is a $WSi_2$ layer; and the thickness of the WSi$_2$ layer is in a range of approximately 1200 Å-1350 Å.

\* \* \* \* \*